(12) United States Patent
Spalding, Jr. et al.

(10) Patent No.: US 10,425,077 B1
(45) Date of Patent: Sep. 24, 2019

(54) TRANSISTOR GATE DRIVER

(71) Applicant: Analog Devices Global Unlimited Company, Hamilton (BM)

(72) Inventors: George Redfield Spalding, Jr., Edinburgh (GB); Chuen Tschi Liang, Edinburgh (GB)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/001,501

(22) Filed: Jun. 6, 2018

(51) Int. Cl.
*H03K 17/30* (2006.01)
*H03K 17/082* (2006.01)
*G01R 19/165* (2006.01)
*H03K 17/687* (2006.01)
*G01R 31/26* (2014.01)
*H03K 17/06* (2006.01)

(52) U.S. Cl.
CPC ..... *H03K 17/302* (2013.01); *G01R 19/16519* (2013.01); *G01R 31/2621* (2013.01); *H03K 17/063* (2013.01); *H03K 17/0822* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 5,821,803 A | 10/1998 | Moore | |
| 8,278,997 B1 | 10/2012 | Kim et al. | |
| 9,106,228 B2* | 8/2015 | Genest | H03K 17/162 |
| 9,231,583 B2 | 1/2016 | Hoyerby et al. | |
| 9,831,756 B2 | 11/2017 | Komiya et al. | |
| 2013/0257177 A1* | 10/2013 | Jacobson | H02M 1/08 |
| | | | 307/115 |
| 2013/0278300 A1 | 10/2013 | Domingo et al. | |
| 2015/0137871 A1* | 5/2015 | Takano | H03K 17/687 |
| | | | 327/389 |
| 2016/0341783 A9 | 11/2016 | Kisslinger da Silva | |

* cited by examiner

*Primary Examiner* — Cassandra F Cox
(74) *Attorney, Agent, or Firm* — Schwegman Lundberg & Woessner, P.A.

(57) ABSTRACT

The present disclosure relates to a gate driver system suitable for driving the gate voltage of one or more transistors. The gate driver system is configured to operate in a first state when the current conducted by the transistor is relatively low and in a second state when the current conducted by the transistor is relatively high. In the second state, the gate voltage is set such that the source voltage at the transistor establishes a lower voltage across a source-driven load than is the case when operating the first state, thereby reducing the level of power consumption in the load during second state operation.

20 Claims, 7 Drawing Sheets

TRANSISTOR GATE DRIVER

FIELD OF THE DISCLOSURE

The present disclosure relates to a system and method for controlling a gate voltage for applying to respective gates of one or more transistors.

BACKGROUND

Transistor gate drivers are used to set and control gate voltages applied to the gates of transistors. In some scenarios, it may be desired to maintain a particular source voltage, for example to ensure that the source terminal of a field-effect transistor is at a suitable voltage to drive a load that is coupled to the source terminal. The source voltage will be approximately equal to the applied gate voltage, less the gate-source voltage of the transistor ($V_{GS}$). Therefore, in order to keep a transistor turned on with a desired source voltage ($V_S$) at the source terminal of the transistor, transistor gate drivers generally set the gate voltage to equal $V_S+V_{GS}$.

One factor that determines the $V_{GS}$ of a transistor is the turn-on threshold voltage ($V_{TH}$). Not only does this vary between different types and designs of transistor, but it also varies between individual transistors of the same type and design as a result of manufacturing tolerances (typically, manufacturers may quote a particular $V_{TH}$ for a transistor, with a tolerance of ±1V). Another factor that determines the $V_{GS}$ of a transistor is the operating state of the transistor. A major aspect of the operating state is the channel current through the transistor ($I_{DS}$). It is a characteristic of transistors that the magnitude of $V_{GS}$ increases as $I_{DS}$ increases (for n-type transistors, $V_{GS}$ is a positive value that will increase as $I_{DS}$ increases and for p-type transistors $V_{GS}$ is a negative value that will become more negative as $I_{DS}$ increases). As a result, for an n-type transistor, as $I_{DS}$ increases, the transistor gate driver will typically increase the gate voltage in line with the increase in $V_{GS}$, thereby maintaining the desired source voltage. Conversely, for a p-type transistor, the transistor gate driver will typically make the gate voltage more negative in line with the more negative $V_{GS}$, thereby maintaining the desired source voltage.

SUMMARY OF THE DISCLOSURE

The present disclosure relates to a gate driver system suitable for driving the gate voltage of one or more transistors. The gate driver system is configured to operate in a first state when the current conducted by the transistor is relatively low and in a second state when the current conducted by the transistor is relatively high. In the second state, the gate voltage is set such that the source voltage at the transistor establishes a lower voltage across a source-driven load than is the case when operating the first state, thereby reducing the level of power consumption in the load during second state operation.

In a first aspect of the present disclosure, there is provided a system for controlling a gate voltage for applying to respective gates of one or more transistors wherein source voltages of the one or more transistors drive one or more respective loads, the system comprising: an output terminal for coupling to the respective gates of one or more transistors; and a gate driver coupled to the output terminal and configured to operate in a plurality of states and to set a gate voltage at the output terminal, wherein the gate driver is further configured to: operate in a first state of the plurality of states when source currents of each of the one or more transistors are less than a current threshold value; and operate in a second state of the plurality of states when the source currents of each of the one or more transistors are greater than the current threshold value, wherein in the first state the gate driver sets the gate voltage to a first voltage and in the second state the gate driver sets the gate voltage to a second voltage, and wherein the first voltage and the second voltage are set such that voltages across the one or more loads driven by the source voltages of the one or more transistors are less when the gate driver is operating in the second state compared with when the gate driver is operating in the first state and the one or more transistors are conducting current, thereby reducing power consumption in the one or more loads when the gate driver is operating in the second state.

The system may further comprise a controller configured to control, based at least in part on the source current of each of the one or more transistors, the state in which the gate driver operates. The controller may be further configured to set the source current of the one or more transistors. The controller may be further configured to set the source current of the one or more transistors by adjusting the size of the one or more loads.

The gate driver may further comprise a voltage source coupled to the output terminal and configured to apply a supply voltage to the output terminal, wherein the first and second voltages are derived, at least in part, from the supply voltage. The voltage source may comprise a step-up converter. The step-up converter may comprise a charge pump. The first voltage may be the supply voltage.

The second voltage may be set based at least in part on the source voltages of the one or more transistors and a second state target transistor source voltage.

Preferably, the one or more transistors comprises two or more transistors. The gate driver may be further configured to operate in a third state when a subset of the two or more transistors have source currents above the current threshold value, wherein the subset comprises at least one, but not all, of the two or more transistors, and wherein in the third state the gate driver sets the gate voltage to a third voltage, and wherein the third voltage is set such that when the gate driver is operating in the third state, voltages across the loads driven by the source voltages of the subset of transistors are greater than when the gate driver is operating in the second state.

The system may further comprise two or more source input terminals for coupling to respective sources of the two or more transistors. The system may further comprise an arbitrator coupled to each of the two or more source terminals and configured to determine, when the gate driver is operating in the second state, the source voltage of the two or more transistors that is driving the lowest voltage across the two or more loads, wherein the second voltage is set based at least in part on the determined source voltage and a second state target transistor source voltage.

The system may be further configured to determine, when the gate driver is operating in the third state, the source voltage of the subset of transistors that is driving the highest voltage across the respective loads of the subset of transistors, wherein the third voltage is based at least in part on the determined source voltage and a third state target transistor source voltage.

The third state target transistor source voltage may be based at least in part on a target transistor source voltage and a tolerance voltage.

The system may be formed on an integrated chip and the output terminal is coupled to a single pin of the integrated chip.

In a second aspect of the present disclosure, there is provided a circuit for monitoring a status of a switch, the circuit comprising: a transistor comprising a drain contact for coupling to a terminal of the switch; an adjustable load coupled to a source contact of the transistor, wherein the load is configured to draw an adjustable load current from the source contact of the transistor, and wherein the status of the switch is determinable based at least in part on the load current; and a gate driver coupled to a gate contact of the transistor and configured to set a gate voltage for the transistor, wherein the gate driver is further configured to: operate in a first state when the load current is less than a current threshold value; and operate in a second state when the load current is greater than the current threshold value, wherein in the first state the gate driver sets the gate voltage to a first voltage and in the second state the gate driver sets the gate voltage to a second voltage, and wherein the first voltage and the second voltage are set such that a voltage across the load is less when the gate driver is operating in the second state compared with when the gate driver is operating in the first state and the transistor is conducting current.

The switch may be a sensing contact that is linked to a high power switch and is configured for sensing a status of the high power switch.

In a third aspect of the present disclosure, there is provided a method for controlling a gate voltage for applying to respective gates of one or more transistors that are each driving a respective load coupled to their respective source terminals, the method comprising: setting the gate voltage to a first voltage when channel currents of each of the one or more transistors are less than a current threshold value; and setting the gate voltage to a second voltage when channel currents of each of the one or more transistors are greater than the current threshold value, wherein the first voltage and the second voltage are set such that voltages across the one or more loads driven by the source voltages of the one or more transistors are less when the gate voltage is set to the second voltage compared with when the gate voltage is set to the first voltage and the one or more transistors are conducting current.

Preferably, the one or more transistors comprise two or more transistors and the method further comprises setting the gate voltage to a third voltage when a subset of the two or more transistors have a channel current greater than the current threshold value, wherein the subset comprises some, but not all, of the two or more transistor wherein the third voltage is set such that voltages across the loads driven by the subset of transistors are greater when the gate voltage is set to the third voltage compared with when the gate voltage is set to the second voltage.

In a further aspect of the present disclosure, there is provided a system for controlling a gate voltage for applying to a gates of a transistor, wherein a source voltage of the transistor drives a respective load, the system comprising: an output terminal for coupling to the gate of the transistor; and a gate driver coupled to the output terminal and configured to operate in a plurality of states and to set a gate voltage at the output terminal, wherein the gate driver is further configured to: operate in a first state of the plurality of states when the transistor is conducting a first source current; and operate in a second state of the plurality of states when the transistor is conducting a second source current, wherein in the first state the gate driver sets the gate voltage to a first voltage and in the second state the gate driver sets the gate voltage to a second voltage, and wherein the first source current is less than the second source current, and wherein the first voltage and the second voltage are set such that voltage across the load driven by the source voltage is less when the gate driver is operating in the second state compared with when the gate driver is operating in the first state and the transistor is conducting current, thereby reducing power consumption in the one or more loads when the gate driver is operating in the second state.

In an even further aspect of the present disclosure, there is provided a method for controlling a gate voltage for applying to a gates of a transistor that is driving a load coupled to its source terminal, the method comprising: setting the gate voltage to a first voltage when the transistor is conducting a first channel current and; and setting the gate voltage to a second voltage when the transistor is conducting a second channel current, wherein the second channel current is greater than the first channel current, and wherein the first voltage and the second voltage are set such that voltage across the load driven by the source voltage is less when the gate voltage is set to the second voltage compared with when the gate voltage is set to the first voltage and the transistor is conducting current.

BRIEF DESCRIPTION OF THE DRAWINGS

Aspects of the present disclosure shall be described, by way of example only, with reference to the following drawings, in which.

Like reference numerals identify like features and where the same feature appears in more than one Figure, for the sake of brevity an explanation of its configuration and operation shall be given only once in the detailed description.

DETAILED DESCRIPTION

Figure 1:
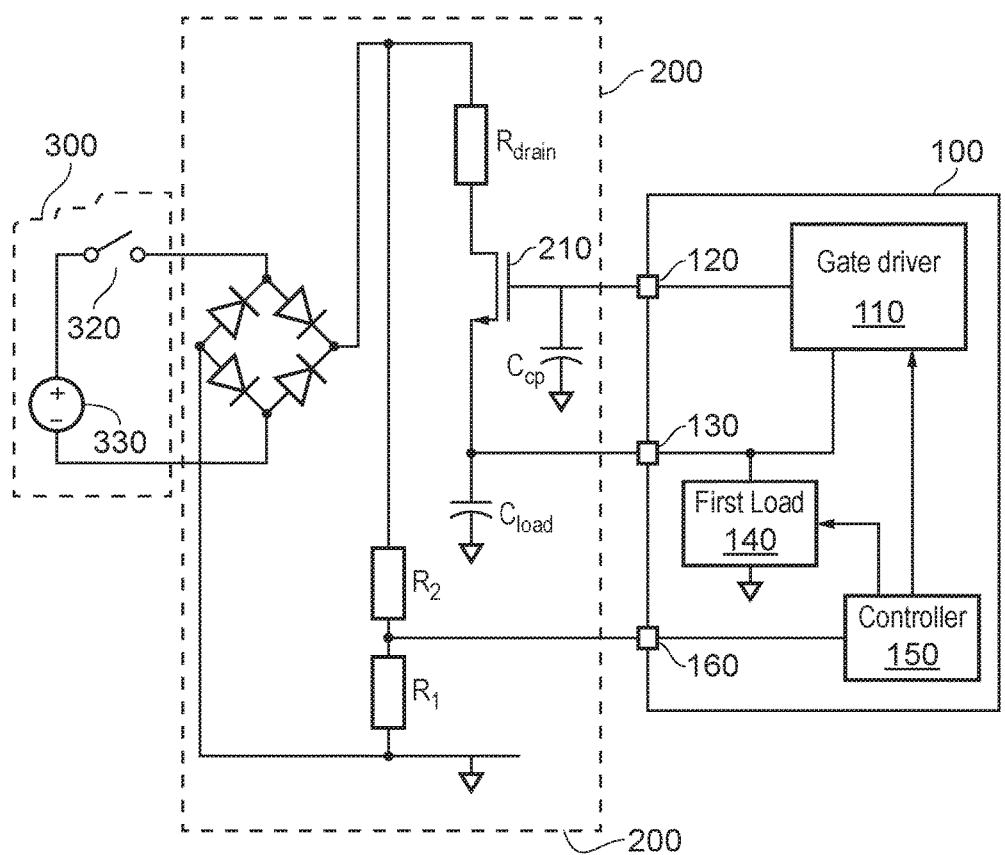
FIG. 1 shows an example schematic diagram of a gate driver system in accordance with an aspect of the present disclosure.

Transistor gate driver circuits are configured to set and control the gate voltage of one or more transistors. When a transistor drives a load coupled to the source of the transistor, the amount of power consumption is dependent on the voltage across the load, which may be changed by changing the source voltage, and the current through the load.

There are times when a load may need to draw a relatively high current. Not only may this cause power efficiency problems, it is also likely to cause significant heat generation in the load, which may necessitate expensive, bulky heat sinks to protect the load and, if the load is part of an integrated circuit (IC), the IC itself. One example of this is with status sensing circuits for high power switches (such as relays or circuit breakers), where the status sensing circuit comprises an adjustable load coupled to sensing contacts that mirror the status of the high power switch. If the voltage across the adjustable load suddenly changes, this may indicate that the status of the sensing contacts, and therefore the high power switch, has changed (for example, because the high power switch has just closed). In order to determine whether that change in voltage is just noise, or genuinely indicates a change in status, the adjustable load may be set to draw a relatively high current for a short period of time. If the voltage continues to increase during this time, there is a genuine status change. If it collapses towards zero, the detected change in voltage may be assumed to have been noise.

The inventors have recognised that whilst this period of high current draw may be relatively short, it can cause a large increase in power dissipation in the adjustable load, which may be problematic. In order to control the power dissipation across the load, they have utilised a transistor, with a source terminal coupled to the load in order to drive the load. By controlling the gate voltage of the transistor, it is possible to control the source voltage, thereby controlling the voltage across the load and, thus, adjusting the power dissipation. However, the inventors have realised that simply controlling the transistor gate voltage to set the lowest possible source voltage (thereby minimising power consumption) is unhelpful because when the transistor channel current suddenly increases as a result of a sudden increase in load current, the gate voltage needs to rapidly increase because of the rapid increase in gate-source voltage of the transistor (as explained in the "background" section). Voltage sources are often relatively slow to increase voltage, so it may be difficult to increase the gate voltage rapidly, which may result in the source voltage falling below the minimum requirements to properly drive the load, or result in the current drawn by the load failing to increase to the desired level.

With this in mind, the inventors have realised a gate driver system that sets a relatively high gate voltage when the channel current/load current is relatively low, thereby setting a relatively high source voltage and, consequently, a relatively high voltage across the load. This means that if the channel current suddenly increases, the gate voltage will already be more than high enough to accommodate the accompanying increase in gate-source voltage. When the channel current/load current is relatively high, the gate driver system sets a relatively low gate voltage, thereby setting a relatively low source voltage and voltage across the load. Thus, power consumption may be reduced during high current operation, which is when power consumption is of most concern.

Thus, by counterintuitively setting the gate voltage to be high during low current and low during high current (which is the opposite way round to usual, as explained in the "background" section), the maximum levels of power consumption may be reduced, thereby protecting the load and IC without bulky, expensive heat sinks, whilst still ensuring that the transistor and load can continue to operate properly even when the current suddenly increases.

The above brief explanation of the gate driver system is based on the operation of an n-type enhancement mode transistor, but as explained in detail later on, the transistor may be of any type and the gate voltage set relatively high or low accordingly. In any event, for all transistor types, the gate driver system sets a first gate voltage that results in a relatively large voltage across the load during low current conductions, and a second gate voltage that results in a relatively small voltage across the load during high current conductions (which is the opposite result to the usual way in which a gate driver would change the gate voltage)

Furthermore, the inventors have also devised gate driver systems that can drive two or more transistors with a single gate voltage. By doing so, where the gate driver system is implemented in an IC, the gate voltage can be output from a single pin of the IC. Furthermore, there is need only for a single gate driver voltage source, which reduces the space required by the gate driver system in the IC and reduces costs.

Single Transistor Control

FIG. 1 shows an example schematic diagram of a gate driver system 100 in accordance with an aspect of the present disclosure. In this example, the gate driver system 100 is driving the gate voltage of an enhancement mode, n-type field effect transistor (FET) 210 that is part of a particular example transistor circuit 200. For the sake of simplicity, the configuration and operation of the gate driver system 100 shall be described in relation to driving the gate voltage of an n-type enhancement mode FET, such as FET 210 represented in FIG. 1. However, it will be appreciated that the gate driver system 100 may be used to drive the gate voltage of any type of FET (for example, MOSFET, JFET, HEMT/HFET, MESFET, etc), of either n-channel type or p-channel type, and of either enhancement mode type or depletion mode type.

Furthermore, whilst the gate driver system 100 is described herein with reference to FETs, it may alternatively be used to drive any other type of transistor (for example, a bipolar junction transistor, an IGBT, etc) and, as such, in the present disclosure the term "gate" also encompasses the base of a transistor, the term "source" also encompasses the emitter of a transistor and the term "drain" also encompasses the collector of a transistor.

The gate driver system 100 comprises a gate driver 110 that is coupled to an output terminal 120. The gate driver 110 is configured to set a gate voltage at the output terminal 120 and the output terminal is suitable for coupling to the gate of one or more transistors (such as FET 210). The gate driver system 110 may also comprise a first load 140 coupled to a first input terminal 130 and a controller 150 configured to control the gate driver 110 and adjust the first load 140 in order to adjust the amount of current drawn by the first load 140 (and, therefore, the channel current $I_{DS}$ of the FET 210).

In the example configuration of FIG. 1, the transistor circuit 200 is configured for use in detecting a status of a switch 320 in a switch circuit 300. When the switch 320 is closed, a voltage supply 310 is coupled to the drain of the FET 210 via a full-bridge diode rectifier and when the switch 320 is open, the voltage supply 310 is decoupled from the transistor circuit 300. The full-bridge diode rectifier is an optional feature of the switch circuit 300, which may be omitted depending on the nature of the voltage source 330.

In one particular example, the switch 320 may be a sensing contact that is linked to a high power switch (such as a circuit breaker or relay) in such a way that when the high power switch changes status (for example, goes from open to closed), the sensing contact likewise changes status. Whilst such high power switches are typically controllable, it can often be difficult to reliably sense if the high power switch is operating correctly (for example, is opening or closing as it should), which is why sensing contacts are often used. The status of the sensing contact may be monitored at least in part by monitoring the sensing current from the switch 320 and a sensing voltage across the switch 320 (this sensing may be performed, for example, but the controller 150). This is explained in more detail in US 2017/0250043, which is incorporated herein by reference in its entirety, particularly between paragraphs [0034] to [0050] and FIGS. 1 to 5a and 5b.

In brief summary, owing to the mechanical nature of high power switches, such as circuit breakers and relays, the metal contacts of the high power switches can act like springs during switching, such that during closing the contacts may initially touch, then bounce apart, then touch again, etc, before finally closing properly. This behaviour is copied by the sensing contact, such that the measured sensing voltage can look like external noise and also be the source of electrical noise. Consequently, rapid switching signals observed in the sensing voltage might be real because of switch bounce, or might be noise. To help differentiate, when a rapid change in sensing voltage is detected, the load 140 may be adjusted (for example, by the controller 150) to quite a low impedance to sink a relatively large amount of the sensing current. If the sensing voltage continues to rise, then it may be assumed that the switching event is real. However, if the sensing voltage collapses towards zero, then it may be assumed that the switching event is noise (this is explained in more detail in paragraph [0050] and FIGS. 5a and 5b of US 2017/0250043).

It will be appreciated that drawing a relatively high current through the load 140 causes relatively high power consumption in the load 140, which is undesirable for efficiency reasons, as well as for protecting the load 140 (and any integrated circuit within which it is located) from potentially damaging high temperatures. Consequently, the load 140 is generally controlled to draw a high sensing current for only a relatively short period of time when a potential switching event is detected in the sensing voltage. Whilst this may help with reducing power consumption, the inventors have recognised that it would still be beneficial to do more.

Consequently, the transistor circuit 200 is implemented in order to couple the load 140 to the switch 320 via the transistor 210 (rather than via a direct coupling). In this way, the source voltage of the transistor 210 may be controlled, thereby controlling the voltage across the load 140 and consequently the power dissipated in the first load 140 (since power=voltage×current), and also protecting the gate driver 110 and the first load 140 from high voltages. However, how best to control the transistor 210 in order to minimise power consumption in the first load 140, whilst still enabling the first load 140 to perform its required functions is not straightforward. In view of this, the inventors have also developed the gate driver system of the present disclosure. It should be appreciated that whilst the gate driver circuit of the present disclosure may find particular use with the transistor circuit 200 for use in monitoring the status of a sensing contact (as described above with reference to US 2017/0250043), it may also be used to control any other transistors that are used to drive some sort of load coupled to their source terminals.

Returning to FIG. 1, Capacitor $C_{cp}$ is included in the transistor circuit 200 to provide loop-stability (i.e., avoid oscillations and over/undershoot) at the gate voltage and avoid transients at the gate voltage (caused by parasitic capacitances) caused by the drain voltage of FET 210 suddenly increasing (for example, because switch 320 has just closed). To this end, $C_{cp}$ will typically be quite large (for example, about 10 nF, or 100 nF, or 1 µF, etc). Furthermore, $C_{cp}$ and $C_{load}$ also provide some transient immunity for the transistor circuit 200.

Resistors $R_1$ and $R_2$ are configured as a potential divider, with $R_2$ generally being significantly larger than $R_1$ in order to divide down the voltage that is applied to first detector terminal 160 so that controller 150 (coupled to the potential divider via a first detector terminal 160) may detect when switch 320 has been closed (for example, the voltage at the first detector terminal 160 may be the sensing voltage described above) whilst still being protected from potentially large voltages. When switch 320 is closed, the controller 150 may adjust the first load 140 to control the current drawn by the first load 140, and therefore the channel current of the FET 210. The controller 150 may also control the gate driver 110 to operate as described in more detail below. For example, when switch 320 is closed, the controller 150 may detect that it is possible that switch 320 has just been closed by virtue of the increase in voltage at the first detector terminal 160 and, in anticipation of a capacitive spike due to a large dV/dt at the drain of FET 210, may set the first load 140 to draw a relatively large current (for example, 100 mA, 200 mA, or 500 mA, or 1 A, etc). By doing so, the first load 140 may help to clear any excess charge and determine whether the switching event is real or just noise in the voltage at the first detector terminal 160. After a period of time, the controller 150 may set the first load 140 to draw a relatively low current (for example, 1 mA, 5 mA, 10 mA, etc), after it has been determined if the switching event is real.

It will be appreciated that whilst FIG. 1 shows the controller 150 being directly coupled to the potential divider of the transistor circuit 200, in practice there may be one or more intervening modules or units, such as an overvoltage comparator and/or analog digital filter (ADC) that is configured to detect a high voltage condition and flag it to the controller 150.

It has been recognised by the inventors that it would be preferable to maintain the FET 210 source voltage as low as possible, in order to minimise the voltage across the first load 140, thereby minimising the power dissipated in the first load 140. It might therefore be concluded that the gate driver 110 should set the gate voltage to whatever voltage is required to cause the source voltage to be at the voltage required to drive the first load 140 (for example, 0.5V, or 1V, etc), and no higher than that. However, the $V_{GS}$ of the transistor is unlikely to be known with certainty (due to manufacturing tolerances, temperature, aging of the transistor, etc), so the gate voltage required to cause the source voltage to be at, but not higher than, the voltage required to drive the first load 140 is likely to be unknown. Furthermore, it may be important that the gate driver 110 can respond quickly to a rapid increase in FET channel current, caused by first load 140 being switched to the relatively high current setting. A characteristic of transistors is that the $V_{GS}$ of the transistor increases with channel current, so to keep the FET 210 on and the source voltage at the required level to drive the first load 140, the gate voltage will need to be rapidly increased when the channel current is rapidly increased. Rapidly increasing the gate voltage may be very difficult, particularly when the gate voltage is derived from a slow to ramp up voltage source (for example, from a step-up converter such as a charge pump). This is explained in more detail later. Consequently, there are conflicting requirements in setting the gate voltage between the desire to minimise power dissipation in the first load 140 and the need to respond quickly to increases in transistor channel current in order to keep the FET 210 on and the source voltage at the required level, as well as complications caused by uncertainty in actual $V_{GS}$.

Having considered these conflicting requirements, the inventors unexpectedly realised that power dissipation is a significant problem when the first load 140 is drawing a very high current, but is less of a problem when the first load 140 is drawing a relatively low current. In one non-limiting example, in its relatively low current mode the first load 140 may draw about 1 mA, so its power dissipation at a source voltage of 0.6V would be 0.6 mW and its power dissipation at a source voltage of about 6V will be 6 mW. The difference between these two values is relatively small and the power dissipation is relatively small. Consequently, there is little to be gained by setting the source voltage to 0.6V compared with 6V. In contrast, in its relatively high current mode the first load 140 may draw about 100 mA, so its power dissipation at a source voltage of 0.6V would be 60 mW and its power dissipation at a source voltage of 6V would be 600 mW. As can be seen, the difference in power dissipation is significant (relative to the different during the low current mode). Consequently, setting the gate voltage to minimise power dissipation in the load is of most concern when the channel current through the FET 210 is relatively high.

Coupled with this realisation, the inventors also realised that rapidly reducing the gate voltage is not usually a problem—it is rapidly increasing the gate voltage that tends to be more problematic. This can be appreciated more fully from the discussion below relating to the voltage source of the gate driver 110.

Having made these realisations, the inventors have configured the gate driver 110 to operate in at least two different states. In a first state, the gate driver 110 sets the gate voltage to a first, relatively high voltage. The first, relatively high voltage is sufficient to keep the transistor on and cause the source voltage to exceed the minimum voltage required by the first load 140 by a reasonable amount. In a second state, the gate driver 110 sets the gate voltage to a second, relatively low voltage. The second, relatively low voltage is sufficient to keep the transistor on and cause the source voltage to at least meet the voltage required by the first load 140, but be less than the source voltage in the first state. The gate driver 110 is configured to operate in the first state when the channel current in the FET 210 is relatively low (for example, when the first load 140 is set to its relatively low current operation) and to operate in the second state when the channel current in the FET 210 is relatively high (for example, when the first load 140 is set to its relatively high current operation). A relatively high channel current is any channel current that exceeds a current threshold value and a relatively low channel current is any current that is less than the current threshold value. The current threshold value may be set to any suitable value, depending on the currents that will be drawn by the first load 140 and the design of the gate driver system 100, the transistor circuit 200 and/or the switch circuit 300. For example, if low current operation of the first load 140 is about 1 mA and high current operation is about 100 mA, the threshold current value may be 5 mA, or 10 mA, or 20 mA, etc. If low current operation of the first load 140 is about 10 μA and high current operation is about 300 μA, the threshold current value may be 30 μA, or 60 μA, etc.

The table below further demonstrates the operation of the gate driver system 100 and resultant source voltage.

| Operation state | Channel current | Gate voltage | Source voltage |
|---|---|---|---|
| First State | Low (e.g., 1 mA) | High (e.g., 8 V) | High (e.g., 6 V) |
| Second State | High (e.g., 100 mA) | Low (e.g., 3 V) | Low (e.g., 0.5 V) |

The current and voltage values given above are merely non-limiting examples. The levels of current and voltage that constitute 'high' and 'low' will depend on the specific circuit implementation and operation. Furthermore, the relationship between source voltage and gate voltage will depend on the particular characteristics of the FET 210.

Thus, it can be seen that in the first state, power consumption in the first load 140 will still be quite low, because the channel current is low. However, because the gate voltage, and therefore source voltage, are relatively high, even after a rapid increase in channel current (and corresponding rapid increase in $V_{GS}$), the gate voltage should still be sufficient to keep the FET 210 on and maintain a sufficient source voltage to drive the first load 140 without having to increase the gate voltage at all. Therefore, even when the gate driver 110 were of a type that is slow to increase gate voltage, the FET 210 will stay on the source voltage will still be sufficient even after a rapid increase in transistor channel current.

After the channel current has gone high, the gate driver 110 switches to the second state and reduces the gate voltage to the second, low voltage. This will reduce the source voltage to a level that is closer to the minimum required to drive the first load 140, thereby minimising power consumption. When the first load 140 is switched back to low current operation, the gate driver 110 then returns to the first state. Because the gate voltage in the second state will still be high enough to keep the FET 210 on and the source voltage at a sufficient level, it does not matter that the gate driver 110 may be slow to increase the gate voltage to the high level after the gate driver 110 switches from the second state to the first state.

Previously, transistor gate drivers have typically been configured to increase gate voltage when the channel current increases. However, by counterintuitively configuring the gate driver 110 to operate in the opposite way, it has been unexpectedly been realised that power consumption in the first load 140 may be kept at a low level whilst still maintaining the gate driver system's ability to respond quickly to a rapid increase in channel current.

Not only does keeping power consumption low mean that efficiency is improved, but also heat dissipation in the first load 140 can be kept within reasonable limits. For example, for the example channel currents given above, by operating in the second state when the channel current is high (100 mA), power consumption within the first load 140 may be limited to 50 mW, rather than the 600 mW that would be consumed in the first load 140 if the gate voltage were kept high. If the first load 140 is part of an integrated chip (IC), this should reduce the potential for IC damage and failure, and also reduce heat sink requirements, thereby saving space and cost.

Figure 2:
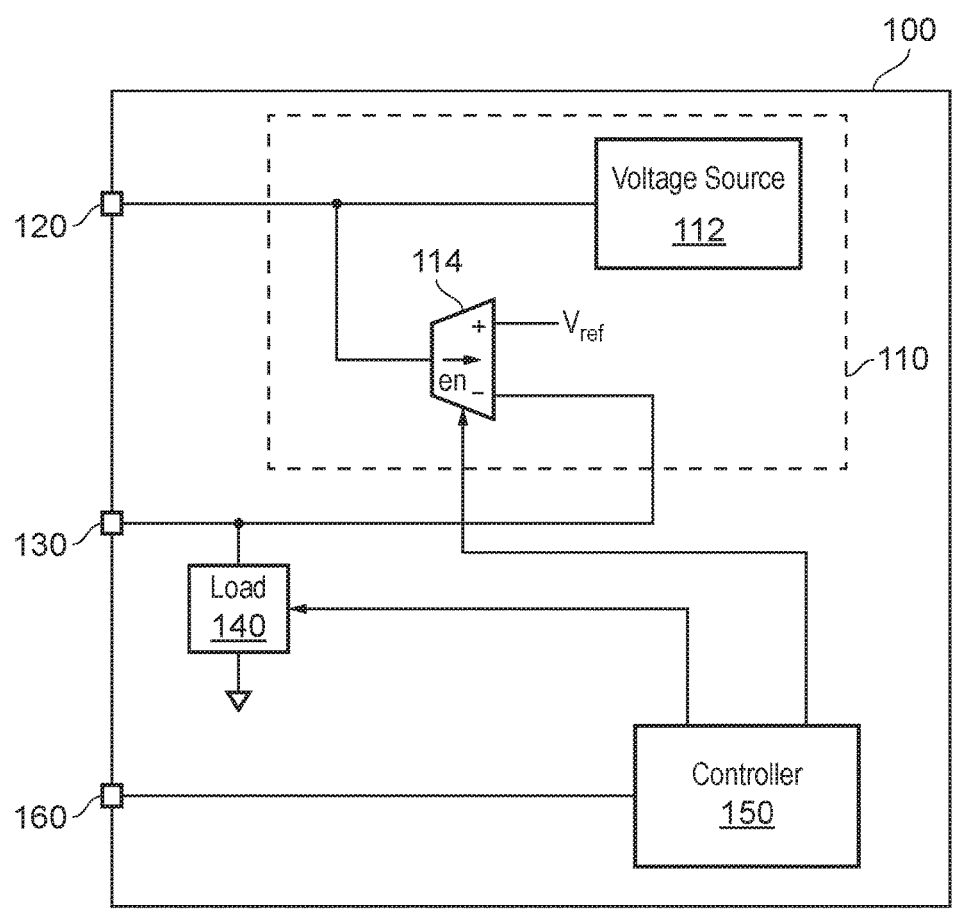
FIG. 2 shows a further example schematic diagram of the gate driver system of FIG. 1.

FIG. 2 shows a further example schematic diagram of the gate driver system 100, which includes example additional details for the gate driver 110. In this example, the gate driver 110 comprises a voltage source 112 and a transconductance amplifier 114. The voltage source 112 is coupled to the output terminal 120 and is configured to apply a supply voltage to the output terminal 120. The voltage source 112 may be a step-up converter, such as a charge pump, which takes a voltage supplied from outside of the gate driver 110 (not represented in the Figures for the sake of simplicity) and steps it up to the supply voltage that is applied to the output terminal 120. The transconductance amplifier 114 is also coupled to the output terminal 120 and is configured to regulate the gate voltage to a level so that the source voltage is substantially equal to the reference voltage ($V_{ref}$) when the transconductance amplifier 114 is enabled. To this end, the voltage source 112 may comprise a relatively high output impedance, to enable the transconductance amplifier 114 to pull down against the output impedance. The controller 150 is configured to enable and disable the voltage regulator 114 using the 'en' pin of the transconductance amplifier 114.

In this example, the controller 150 is configured such that when it sets the first load 140 to low current operation (i.e., transistor channel current below the current threshold value), it disables the transconductance amplifier 114, thereby controlling the gate driver 110 to be in the first state. In the first state, the gate voltage voltage is allowed to go to the supply voltage of the voltage source 112. Therefore, if the supply voltage were 6V (for example), the gate voltage in the first state would be 6V. When the controller 150 sets the first load 140 to high current operation (i.e., transistor channel current above the current threshold value), it enables the transconductance amplifier 114, thereby controlling the gate driver 110 to be in the second state. In the second state, the transconductance amplifier 114 regulates the gate voltage down until the source voltage (which is the voltage at the first input terminal 130, and therefore the voltage at the inverting terminal of the transconductance amplifier 114) matches $V_{ref}$. $V_{ref}$ may be set to the level of source voltage that is desired during operation in the second state (for example, the voltage level that is required in order to drive the first load 140). Consequently, in the second state the gate voltage is set based on the source voltage of the FET 210 and a target transistor source voltage, such that the gate voltage is adjusted to cause the source voltage of the FET 210 to substantially equal the target transistor source voltage. Therefore, if the target source voltage $V_{ref}$ is set to 0.6V, in the second state the gate voltage will be set to whatever voltage is required to cause the FET 210 to have a source voltage of approximately 0.6V.

It will be appreciated that the voltage source 112 and voltage regulator 114 configuration represented in FIG. 2 is merely one example of how the gate driver 110 may be configured to operate in the first state and the second state and the gate driver 110 may be configured in any other suitable way. For example, the gate voltage in the first state may be derived from the supply voltage in any suitable way (for example, the gate voltage may be equal to the supply voltage as in the example above, or may be less than the supply voltage by virtue of being regulated down in some way). Furthermore, the transconductance amplifier 114 is merely one example way of regulating the voltage down during the second state. In an alternative, the gate driver may be configured in any suitable way that enables it to operate in the first state and second state.

Two Transistor Control

Figure 3:
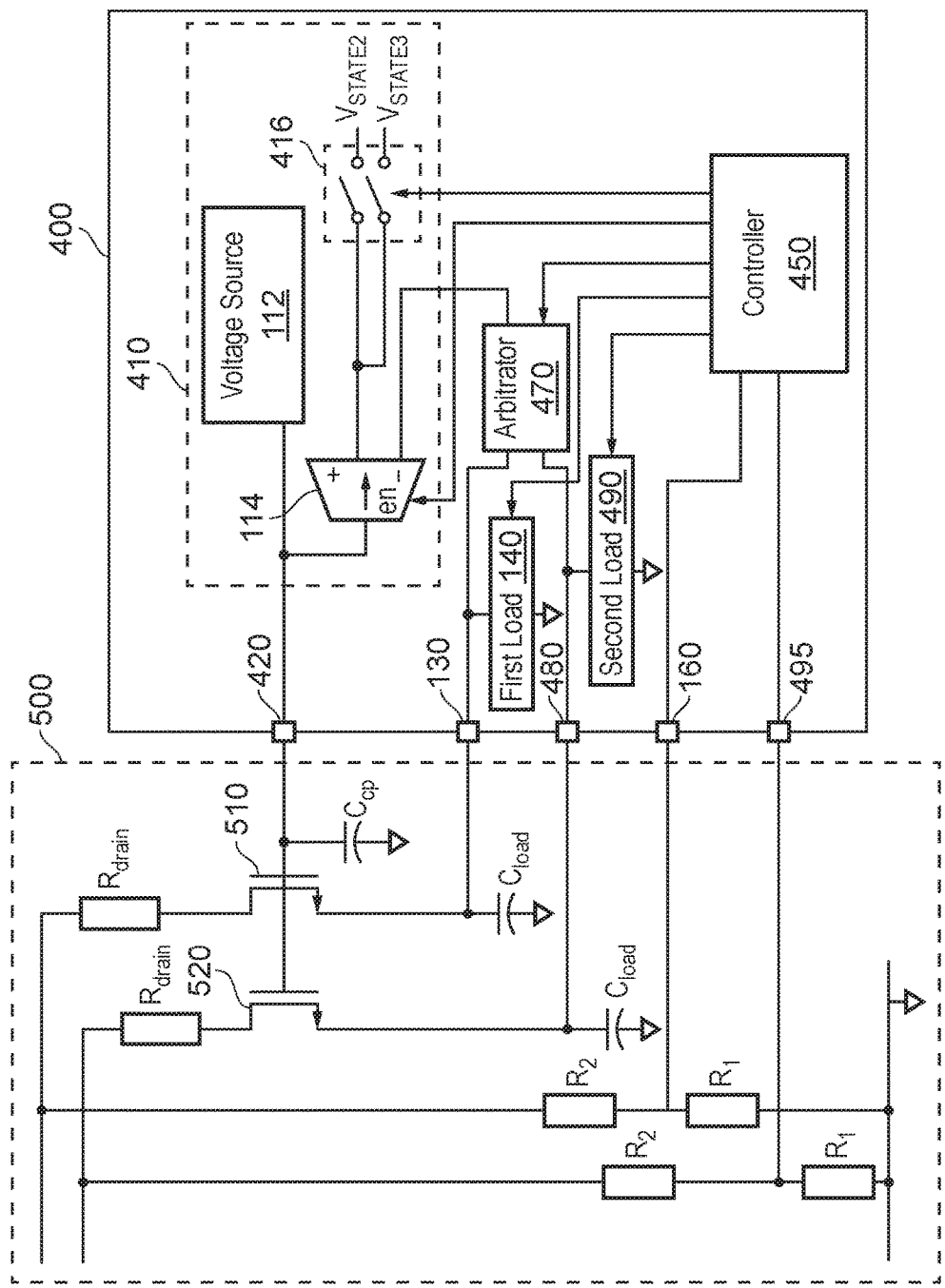
FIG. 3 shows an example schematic diagram of a gate driver system in accordance with a further aspect of the present disclosure.

FIG. 3 shows an example schematic diagram of a gate driver system 400 in accordance with a further aspect of the present disclosure. The two FETs 510 and 520 form part of a transistor circuit 500, which is very similar to transistor circuit 200, except that the drain of each of the FETs 510 and 520 may be coupled to different switch circuits, each similar to switch circuit 300 (those switch circuits are not represented in FIG. 3 for the sake of simplicity). The operation of the transistor circuit 500 is similar to that of transistor circuit 200 and so shall not be described again.

The gate driver system 400 is configured to drive the gate voltage of the two FETs 510 and 520 from a single output terminal 420. The two FETs 510 and 520 are independent of each other in that their drain terminals are each coupled to separate switch circuits and their source terminals are not coupled to each other. However, because the gates of both FETs 510 and 520 are driven by the same gate voltage, they are not controlled independently by the gate driver system 400.

There may be a number of benefits to driving the gates of both FETs 510 and 520 from a single output terminal 420 of the gate driver system 400. First, by using a single output terminal 420, rather than two separate output terminals, if the gate driver system 400 is implemented on an integrated chip (IC), the output terminal 420 may be implemented by a single pin of the IC. Given that pin usage is often a valuable resource in ICs, this may be a significant benefit. Second, if each FET 510 and 520 were driven by a different output terminal of the gate driver system 400, two capacitors $C_{cp}$ would be required, one for each output terminal. However, in the configuration represented in FIG. 3, only a single $C_{cp}$ is required. Given that the $C_{cp}$ needs to be relatively large in order to provide loop stability, needing only a single $C_{cp}$ may save significant space (particularly where $C_{cp}$ is part of an IC) and may also save costs. Third, if each FET 510 and 520 were driven by a different output terminal of the gate driver system 400, two gate drivers would be needed. However, in the configuration represented in FIG. 3, both FETs 510 and 520 can be driven from a single gate driver 410. Consequently, significant power savings may be realised and, given that voltage sources (for example, step-up converters such as charge pumps) tend to be quite large, significant space and costs may also be saved, which is particularly beneficial when the gate driver system 400 is implemented in an IC.

However, driving the gates of two FETs 510 and 520 from a single output terminal is not straightforward, for a number of reasons. Different individual transistors of the same type and design may have very different turn-on threshold voltages ($V_{TH}$) (typically, manufacturers may quote a particular $V_{TH}$ for a transistor, with a tolerance of ±1V). For example, the actual $V_{TH}$ of the first FET 510 may be 1.2V and the actual $V_{TH}$ of the second FET 520 may be 2.7V. When the gate driver 410 is operating in the second state (as described earlier), if it sets the gate voltage based on the source voltage of the first FET 510 and a target source voltage of 0.5V, it may set the gate voltage to 2.5V (since $V_{GS}$ of the first FET 510 will be greater than the $V_{TH}$ of the first FET 510, by virtue of the high channel current in the first FET 510). This gate voltage is below $V_{TH}$ of the second FET 520, so the second FET 520 will turn off.

A further problem is that, at times, one of the FETs 510 and 520 may be conducting a relatively high channel current and the other a relatively low channel current. For example, the first FET 510 may be conducting a relatively high channel current and the second FET 520 may be conducting a relatively low channel current. If the gate driver 410 operates in the first state, the source voltage of the first FET 510 will be relatively high, meaning that the power consumption of the first load 140 will be very high. Not only is this inefficient, but if the gate driver system 400 is implemented in an IC it may cause damage to the IC. However, if the gate driver 410 operates in the second state, not only may there be problems with the second FET 520 inadvertently being turned off (for the reasons explained in the above paragraph), but even if it remains on, the gate voltage may not be sufficiently high for the second FET 520 to remain on if it experiences a rapid increase in channel current.

In order to address these issues, the gate driver 410 in accordance with the second aspect of this disclosure has been developed. The gate driver 410 is configured to operate in three different states. The first state is the same as that described earlier and the gate driver 410 is configured to operate in this state when the channel currents in both of the FETs 510 and 520 are low (i.e., less than the current threshold value). The second state is very similar to that described earlier and the gate driver 410 is configured to operate in this state when the channel currents in both of the FETs 510 and 520 are high (i.e., greater than the current threshold value). The only slight difference is that the gate driver 410, when operating in the second state, is configured to set the gate voltage based on the lowest source voltage of the two FETs 510 and 520 (whereas gate driver 110 is driving the gate voltage of only a single transistor 210). The reasons for setting the gate voltage based on the lowest of the two source voltages are explained later. In a third state, the gate driver 410 is configured to set the gate voltage to a third voltage that is higher than the gate voltage in the second state. The third voltage will also be lower than the gate voltage of the first state whenever possible (as explained in more detail later). The gate driver 410 is configured to operate in the third state when one of the two transistors 510 and 520 has a relatively high channel current (i.e., greater than the current threshold value) and the other of the two transistors has a relatively low channel current (i.e., lower than the current threshold value). Further details of the third voltage are explained later.

The table below further demonstrates the operation of the gate driver system 400.

| Operation state | Channel current (first FET 510) | Channel current (second FET 520) | Gate voltage | Source voltage |
| --- | --- | --- | --- | --- |
| First State | Low (e.g., 1 mA) | Low (e.g., 1 mA) | High (e.g., 8 V) | High (e.g., 6 V) |
| Second State | High (e.g., 100 mA) | High (e.g., 100 mA) | Low (e.g., 3 V) | Low (e.g., 0.5 V) |
| Third State | Low (e.g., 1 mA) | High (e.g., 100 mA) | Mid (e.g. 5 V) | Mid (e.g., 2.8 V) |
| Third State | High (e.g., 100 mA) | Low (e.g., 1 mA) | Mid (e.g. 5 V) | Mid (e.g., 2.8 V) |

The current and voltage values given above are merely non-limiting examples. The levels of current and voltage that constitute 'high', 'mid' and 'low' will depend on the specific circuit implementation and operation. Furthermore, the relationship between source voltage and gate voltage will depend on the particular characteristics of the transistors and, owing to different characteristics of different transistors, the actual source voltage of each of the two FETs 510 and 520 are likely to be different for a given gate voltage.

The operation of the gate driver system 400 shall now be described in more detail, with reference to FIG. 3. The gate driver system 400 comprises a gate driver 410, which in this particular example comprises the voltage source 112 and transconductance amplifier 114 (as described earlier), as well as a switching arrangement 416. The gate driver system 400 also comprises the first input terminal 130, a second input terminal 480, the first load 140 and a second load 490 (which is similar to the first load 140). The controller 450 is similar to controller 150 and controls the first load 140 based on the detected voltages at the first detector terminal 160 and controls the second load 490 based on detected voltages at a second detector terminal 495, as described earlier.

When the controller 450 has set both the first load 140 and the second load 490 to low current operation, it will control the gate driver 410 to operate in the first state. In the particular implementation of the gate driver 410 represented in FIG. 3, the controller 450 does this by disabling the transconductance amplifier 114 so that the gate voltage at the output pin 420 is set to the supply voltage from the voltage source 112 (for example, 8V). Consequently, in the first state, the gate driver system 400 will be able to respond quickly to any rapid increase in the channel current of either FET 510 or 520 (for the same reasons as explained earlier with reference to gate driver system 100).

When the controller 450 has set both the first load 140 and the second load 490 to high current operation, it will control the gate driver 410 to operate in the second state. In the particular implementation represented in FIG. 3, the controller 450 does this by enabling the transconductance amplifier 114 and controlling the switching arrangement 416 to couple $V_{STATE2}$ to the non-inverting pin of the transconductance amplifier 114 and decouple $V_{STATE3}$ from the non-inverting pin of the transconductance amplifier 114. $V_{STATE2}$ is the second state target source voltage for the transistor having the lowest source voltage. To this end, in the second state, the controller 450 enables the arbitrator 470, which is configured (when enabled by the controller 450) to select the lowest voltage out of the first FET's source voltage and the second FET's source voltage and apply the selected voltage to the inverting pin of the transconductance amplifier 114. As a result, the gate driver 410 will set the gate voltage to a value that causes the lowest of the two source voltages to substantially equal $V_{STATE2}$. The reason for the lowest of the two source voltages being selected is in view of the likelihood that the two FETs 510 and 520 will have different a $V_{TH}$, as a result of manufacturing tolerances. By setting the gate voltage based on the lowest source voltage, the set gate voltage should result in both FETs 510 and 520 being on and having source voltages that are sufficient to drive the first load 140 and the second load 490. Consequently, in the second state, power consumption in the first load 140 and second load 490 may be minimised (as explained earlier with reference to gate driver system 100), whilst still ensuring that both FETs 510 and 520 are kept on.

When the controller 450 has set only one of the first load 140 or the second load 490 to high current operation, it will control the gate driver 410 to operate in the third state. In the particular implementation of the gate driver 410 represented in FIG. 3, the controller 450 does this by enabling the transconductance amplifier 114 and controlling the switching arrangement 416 to couple $V_{STATE3}$ to the non-inverting pin of the transconductance amplifier 114 and decouple $V_{STATE2}$ from the non-inverting pin of the transconductance amplifier 114. $V_{STATE3}$ is the third state target source voltage for the FET that is conducting a high current. The arbitrator may have bypasses for each of the first FET 510 source voltage and the second FET 520 source voltage, which are controllable by the controller 450. In the third state, the controller 450 may enable the bypass for whichever of the two FETs 510, 520 is conducting a high current. For example, if the first FET 510 is conducting the high current, the controller 450 may enable a first bypass in the arbitrator 470 so as to couple the first input terminal 130 to the inverting input of the transconductance amplifier 114. If the second FET 520 is conducting the high current, the controller 450 may enable a second bypass in the arbitrator 470 so as to couple the second input terminal 480 to the inverting input of the transconductance amplifier 114. This operation of the arbitrator 470 may be further appreciated from the example arbitrator details described below with reference to FIG. 4.

The voltage $V_{STATE3}$ is a higher voltage than $V_{STATE2}$. $V_{STATE3}$ is set to a voltage that is approximately equal to $V_{STATE2}$ plus a tolerance voltage ($V_{TOL}$). $V_{TOL}$ may be set to a value that is based on the maximum $V_{TH}$ difference that could exist between the two FETs 510 and 520. For example, if the manufacturer quotes $V_{TH}$ of the two FETs to be 1.5V±1V, $V_{TOL}$ may be 2V. Therefore, in this example if $V_{STATE2}$ is, for example, 0.5V, then $V_{STATE3}$ may be set to 2.5V. By setting the gate voltage in this way, the source voltages of the two FETs 510 and 520 should usually both be less than in the first state (thereby saving power consumption in the load that is operating under high current) and the gate voltage should still be sufficiently high for the FET that is currently conducting a low channel current to experience a rapid increase in channel current and still remain on with sufficient source voltage to drive its load, even in the event of the most extreme possible mismatch in $V_{TH}$ between the two transistors 510 and 520. The only time in which the gate voltage in the third state would not be less than the gate voltage in the first state is if the supply voltage provided by the voltage source 112 is equal to or less than the gate voltage required to drive the high current conducting FET 510 or 520 to have a source voltage substantially equal to $V_{STATE3}$. For example, if $V_{STATE3}$ is 2.5V and $V_{GS}$ of the FET that is conducting the high channel current is 3V, the required gate voltage would be 5.5V. However, if the supply voltage provided by the voltage source 112 is only 5V, then the gate voltage set by the gate driver 410 in both the first state and the third state would be 5V. Nevertheless, it will be appreciated that wherever possible (given the particular $V_{TH}$ and $V_{GS}$ characteristics of the FETs 510 and 520, and the size of the supply voltage provided by the voltage source 112), in the third state the gate voltage will be set to a value that is lower than the gate voltage in the first state.

Figure 4:
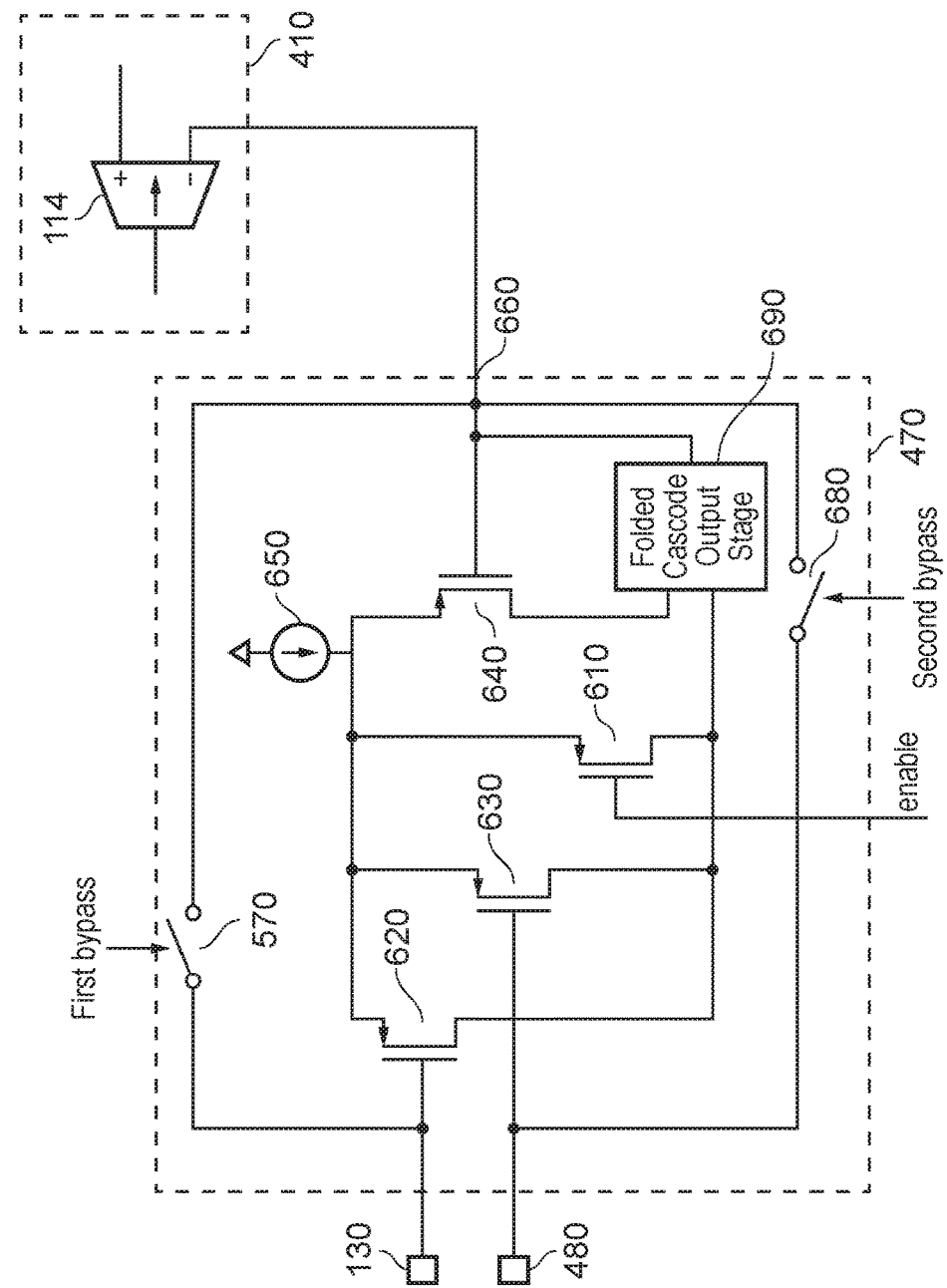
FIG. 4 shows an example implementation of an arbitrator forming part of the gate driver system of FIG. 3.

FIG. 4 shows an example implementation of the arbitrator 470, configured to perform the functionality described above. In particular, the arbitrator 470 is configured such that in the first state the controller 450 can disable the arbitrator 470, in the second state the controller 450 can enable the arbitrator to select the lowest voltage out of the first FET's source voltage and the second FET's source voltage and output the selected voltage to the inverting pin of the transconductance amplifier 114, and in the third state the controller 450 can bypass the source voltage of whichever of the two FETs 510, 520 are conducting a high current to apply that source voltage to the inverting pin of the transconductance amplifier 114 (i.e., couple the first input terminal 130 to the inverting pin of the transconductance amplifier 114, or couple the second input terminal 480 to the inverting pin of the transconductance amplifier 114).

The example implementation of the arbitrator 470 represented in FIG. 4 comprises an enable FET 610, a first load FET 620, a second load FET 630, a FET 640, a current source 650 and an output 660. The arbitrator 470 is configured with a compound differential pair, with the enable FET 610, the first load FET 620 and the second load FET 630 representing one half of the compound differential pair and the FET 640 representing the other half of the compound differential pair. The interconnections between the arbitrator 470 and other relevant features of the gate driver system 400 are represented in FIG. 4, but the other features of the gate driver system 400 are not represented for the sake of clarity. The controller 450 may be configured to control the arbitrator 470 using the 'enable', 'first bypass' and 'second bypass' inputs.

The skilled person will appreciated from an understanding of compound differential pair circuits that the voltage on output 660 will substantially equal the smallest of the voltages applied to the gates of the enable FET 610, the first load FET 620 and the second load FET 630.

The arbitrator 470 is configured with a folded cascode output stage 690 to convert the output of the compound differential pair circuit into the voltage domain and the skilled person will readily understand how the folded cascode output stage 690 may be implemented, and how it operates, so no further explanation shall be provided herein. It will be appreciated that depending on the configuration of the module/circuit at the output of the arbitrator 470, in an alternative the folded cascode output stage 690 may be omitted (for example, if there is some other intervening element of module between the output of the arbitrator 470 and the transconductance amplifier 114 that renders the folded cascode output stage 690 unnecessary).

In the first state of the gate driver system 400, the controller 450 may disable the arbitrator 470 by setting the voltage on 'enable' to a very low level, in particular to a lower level than $V_{STATE1}$ or $V_{STATE2}$, for example 0V, and controlling 'first bypass' and 'second bypass' to disable the bypass circuits (for example, opening both the first switch 670 and the second switch 680). In this way, the gate voltage of enable FET 610 will be lower than the gate voltages on the first load FET 620 and the second load FET 630, and the voltage at the output 660 should match the gate voltage of the enable FET 610. Since the gate voltage of the enable FET 610 is set to a very low level, the voltage at the inverting input of the transconductance amplifier 114 will be lower than $V_{STATE1}$ or $V_{STATE2}$, and so the gate voltage will be allowed to go high, to the level of the output of the voltage source 112.

In the second state of the gate driver system 400, the controller 450 may enable the arbitrator 470 by setting the voltage on 'enable' to a high voltage that is higher than the maximum possible source voltage of the FETs 510 and 520. That voltage level will depend on the particular configuration of the gate driver 410 and the FETs 510 and 520, but may be, for example, the same or similar to the supply voltage provided by the voltage source 112 (since the source voltages of FETs 510 and 520 will always be lower than that, owing to $V_{GS}$ of the FETs). In the second state, the controller 450 may also control 'first bypass' and 'second bypass' to disable the bypass circuits (for example, opening both the first switch 670 and the second switch 680). Consequently, the voltage at output 660 should be substantially equal to the lowest of the voltages at the gates of the first load FET 620 and the second load FET 630. Thus, by virtue of the coupling of the gates of the first load FET 620 and the second load FET 630 to the first input terminal 130 and the second input terminal 480 respectively, the voltage at the output 660 should be substantially equal to the lowest source voltage of the FETs 510 and 520.

In the third state of the gate driver system 400, the controller 450 may set the voltage on 'enable' to a very low level, for example 0V, and may control 'first bypass' and 'second bypass' to disable one of the bypass circuits and enable the other (for example, opening one of the first switch 670 and the second switch 680 and closing the other). For example, if the first FET 510 is the FET conducting a high current, the first switch 670 may be closed and the second switch 680 opened, causing the source voltage of the first FET 510 to be applied to the output 660 (thereby bypassing the lowest voltage selector compound differential pair circuit). If the second FET 520 is the FET conducting a high current, the second switch 680 may be closed and the first switch 670 opened, causing the source voltage of the second FET 520 to be applied to the output 660 (thereby bypassing the lowest voltage selector compound differential pair circuit).

It will be appreciated that FIG. 4 represents one particular, non-limiting, example of how the arbitrator 470 may be implemented and that various alternatives are possible to enable the arbitrator to perform the functionality described above for the first, second and third states. For example, the arbitrator 470 may be configured to select the lowest source voltage of the two FETs 510 and 520 in the third state in any other suitable way, rather than using a compound differential pair circuit, such as using operational amplifier comparators, etc. Furthermore, if a compound differential pair circuit is utilised, whilst the circuit represented in FIG. 4 uses FETS, it will be appreciated that the compound differential pair circuit may be implemented using any suitable type of transistor. Furthermore, the enable FET 610 may be omitted entirely and the compound differential pair circuit may be disabled in the first and third states by any other suitable means, for example using a switch positioned between the gate of FET 540 and the output 660 (thereby isolating the gate of FET 640 from the output 660) and/or using switches positioned at the gates of the first load FET 620 and the second load FET 630 (thereby isolating the gates of the first load FET 620 and the second load FET 630 from the first input terminal 130 and the second input terminal 480).

Furthermore, the bypass configuration may be implemented in any suitable, alternative way. Rather than implementing switches 670 and 680, a series switch may be positioned between first input terminal 130 and the gate of the first load FET 620, and a further series switch positioned between the second input terminal 480 and the second load FET 630. When it is desired for one of the inputs to effectively bypass the compound differential pair and appear at the output 660 (for example, the input at the first input terminal 130), the series switch at the other input (for example, the series switch at the second input terminal 480) may be opened and the voltage at the gate of that FET (for example, the second load FET 630) pulled up to a high value. This should result in the voltage at the other FET (for example, the first load FET 620) being the lowest voltage, which should therefore be selected by the compound differential pair and applied to the output of the arbitrator 470.

Furthermore, the switches 670 and 680 may be any form of switches that are controllable by the controller 450, for example mechanical switches or solid state switches such as transistors. Furthermore, bypass paths in the arbitrator 470 may alternatively be implemented and controlled in any other suitable way.

Figure 5:
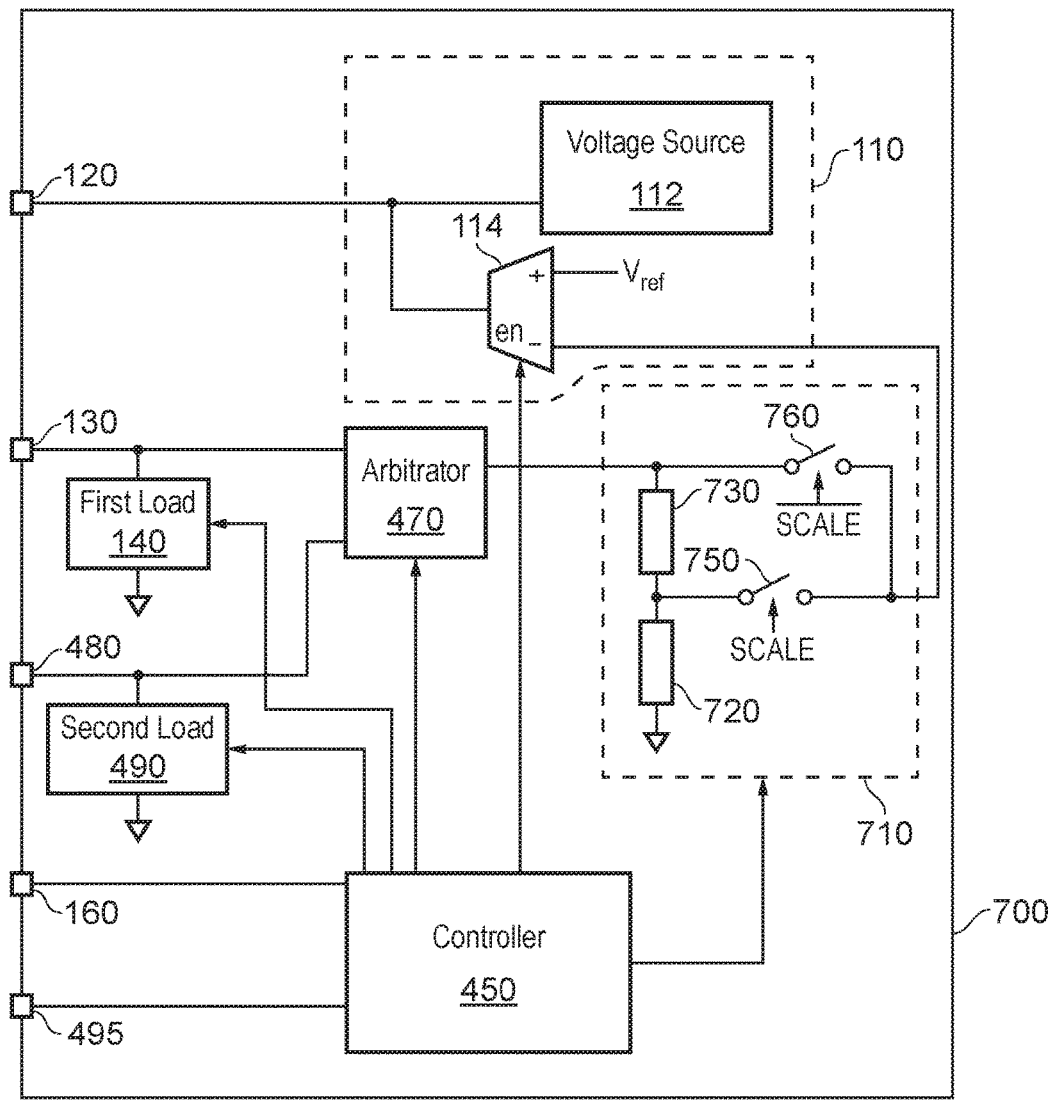
FIG. 5 shows an example schematic diagram of a gate driver system in accordance with a further aspect of the present disclosure.

FIG. 5 shows an example schematic diagram of a gate driver system 700 in accordance with a further aspect of the present disclosure. The gate driver system 700 is very similar to the gate driver system 400 represented in FIG. 3, except for the inclusion of a scaler 710 and the omission of the switching arrangement 416. The operation of the scaler 710 shall be described below, but for the sake of brevity we refer to the above passages for an explanation of the operation of all other features of the gate driver system 700.

The gate driver system 700 comprises the gate driver 110, the operation of which is described in detail above with reference to FIG. 2. The controller 450 is configured to control the scaler 710 using a "scale" control signal.

When the gate driver system 700 is operating in the second state, the controller 450 may be configured to apply a "scale" signal to open switch 750 and close switch 760. By applying the "scale" signal in this way, the potential divider formed by resistors 720 and 730 is bypassed and the signal output by the arbitrator 470 may be passed, effectively unaltered, to the output of the scaler 710. Since the arbitrator 470 is configured to select the lowest source voltage of FETs 510 and 520 when operating in the second state, this means that the lowest source voltage will be applied by the scaler 710 to the inverting input of the transconductance amplifier 114. As explained earlier with respect to FIG. 2, this should cause the gate driver 110 to set the gate voltage such that the source voltage of the FET 510 or 520 with the largest $V_{GS}$ (and therefore lowest source voltage) is substantially equal to $V_{ref}$ (for example, 0.5V).

When the gate driver system 700 is operating in the third state, the controller 450 may be configured to apply a "scale" signal to close switch 750 and open switch 760. By applying the "scale" signal in this way, the potential divider formed by resistors 720 and 730 reduces down (i.e., scales) the voltage output from the arbitrator 470, such that the voltage output by the scaler 710 is a fraction of the voltage output by the arbitrator 470. The ratio of the values of resistors 720 and 730 may be set based on a ratio of the target transistor source voltages in the second and third state. For example, if the target lowest source voltage in the second state (i.e., "low" voltage) is 0.5V and the target source voltage in the third state (i.e., "mid" voltage) is 2.5V, the ratio of the desired transistor source voltages in the second and third states is 1:5. Consequently, the resistor 730 may be set to a value that is five times higher than the value of resistor 720, such that in the third state the output voltage of the scaler 710 is one fifth of the voltage output from the arbitrator 470. The consequence of this is that the transconductance amplifier 114 may then compare the voltage output from the scaler 710 with Vref to set the gate voltage, thereby causing the source voltage of the high current conducting FET 510 or 520 to be substantially equal to the third state target source voltage (i.e., "mid" voltage), which in this particular example is five times higher than the desired "low level voltage, $V_{ref}$.

Therefore, it can be appreciated that by implementing the scaler 710, the gate driver system 700 may achieve the desired functionality of the second state and the third state in an alternative way to the gate driver system represented in FIG. 3 (i.e., without requiring the switching arrangement 416 or the two different reference voltages $V_{STATE2}$ and $V_{STATE3}$). It will also be appreciated that the scaler 710 represented in FIG. 5 is merely one non-limiting example implementation. The scaler 710 may alternatively be configured in any other suitable way to be controllable to scale the output voltage of the arbitrator 470 by a desired scaling ratio when the gate driver system 700 is operating in the third state. The switches 750 and 760 770 may be implemented in any suitable way, for example using solid state switches, such as transistors, or using controllable mechanical switches.

Furthermore, whilst in the gate driver system 700 the scaler 710 is located at the output of the arbitrator 470, in an alternative arrangement matched (i.e., duplicate) scalers may be located at each input to the arbitrator 470, such that in the third state the scalers reduce down the source voltages of the FETs 510, 520 before they reach the arbitrator 470. Each of the scalers may be controlled by the controller 450 as described above and should be matched to each other in order to scale voltages by the same amount as each other. Whilst implementing the scalers in this way may increase the number of components and the complexity of control, it may in some instances be beneficial to scale the voltages down before the arbitrator 470, for example so that the arbitrator may be configured to handle lower voltages.

Three or More Transistor Control

In a further example implementation of the present disclosure, the operation of a gate driver system configured to set the gate voltage of three or more FETs shall be described. The description shall be based on the case where three FETs are being controlled, but it will be appreciated that the described operation may equally be applied to the control of four or more FETs.

The gate driver system 400 and the gate driver system 700 may equally be configured to control three FETs, with a minor modification to the arbitrator and with an additional input terminal, an additional detector terminal and an additional controllable load for the third FET. These modifications to the gate driver system are not represented in any Figures, for the sake of simplicity, but are described below.

In the modified configuration, the output terminal 420 may be coupled to the gates of all three FETs and the gate driver system may include a further input terminal (similar to the first input terminal 130 and the second input terminal 480) for coupling to the source of the third FET and a further detector terminal (similar to the first detector terminal 160 and the second detector terminal 495). A third load may be coupled to the further input terminal and may be controllable by the controller 450 (similarly to the first load 140 and the second load 490). The controller 450 may also be coupled to the further detector terminal (similar to the first detector terminal 160 and the second detector terminal 495).

The operation of the modified gate driver system in the first state (i.e., all transistors conducting a low current) and the second state (i.e., all transistors conducting a high current) is the same as described above with reference to FIGS. 3 and 5. In the third state, the arbitrator 470 is configured to select the highest source voltage out of the transistors that are conducting a high current, such that the highest source voltage can be controlled to the third state target voltage (i.e., "mid" voltage), described above. The arbitrator 470 may be configured in any suitable way to perform this function. For example, it may be configured to comprise a further compound different pair circuit, similar to that represented in FIG. 4, but configured to select the highest source voltage rather than the lowest (for example, by using n-type FETs with suitable coupling to a current source and folded cascode output stage). Consequently, the arbitrator 470 may be configured to be controllable by the controller 450 to select the lowest source voltage in the second state and to select the highest source voltage in the third state. The skilled person will readily appreciate that there are many different ways in which the arbitrator 470 may be configured to perform such functionality.

In accordance with this implementation of the arbitrator 470, if only one of the three FETs is conducting a high voltage, the arbitrator 470 will output the source voltage of that FET (which, by definition is the highest source voltage of the FETs that are conducting a high voltage). If two of the three FETs are conducting a high voltage, the highest source voltage of those FETs is output by the arbitrator 470. The consequence of selecting the highest source voltage (as opposed to, say, the lowest source voltage), is that the power consumption in the loads may be reduced. This is because the third state target source voltage (i.e., "mid" voltage) may be set to allow for the tolerance voltage ($V_{TOL}$), as explained earlier. If the gate voltage is set to cause the highest source voltage to substantially equal the third state target source voltage, even in the worst case scenario of FET mismatch, the source voltage of the other FETs should only be $V_{TOL}$ below the third state target source voltage. Thus, all source voltages should still be at least at the minimum level to drive their respect source loads. For example, if the minimum source voltage required to drive the source loads is 0.8V and $V_{TOL}$ is 1.9V, then the third state target source voltage should be about 2.7V. If the gate voltage is set such that in the third state the highest source voltage of the high conducting FETs is substantially equal to 2.7V, even in the worst case scenario the source voltages of the other high conducting FETs should be at least 0.8V. On the other hand, if the gate voltage were set such that in the third state the lowest source voltage of the high conducting FETs is substantially equal to 2.7V (which would be necessary to ensure that the gate voltage is high enough to accommodate the low current conducting FET(s) suddenly being turned to high current conducting), then the source voltage of the other high current conducting FETs would be at least 2.7V. This would result in unnecessarily higher power consumption in the loads.

It will be appreciated that in the example case where two FETs are being controlled by the gate driver system of the present disclosure, in the third state the gate voltage will be set such that the highest source voltage of the high current conducting FETs is substantially equal to the third state target source voltage (since in the two FET example, in the third state only one of the FETs will be conducting a high current, and therefore has the highest source voltage of the FETs that are conducting a high current). Therefore, a gate drive system configured to drive the gates of two or more FETs may comprise the arbitrator 470 configured to select, when operating in the third state, the highest source voltage of the FETs that are being controlled by the gate drive system.

Figure 6:
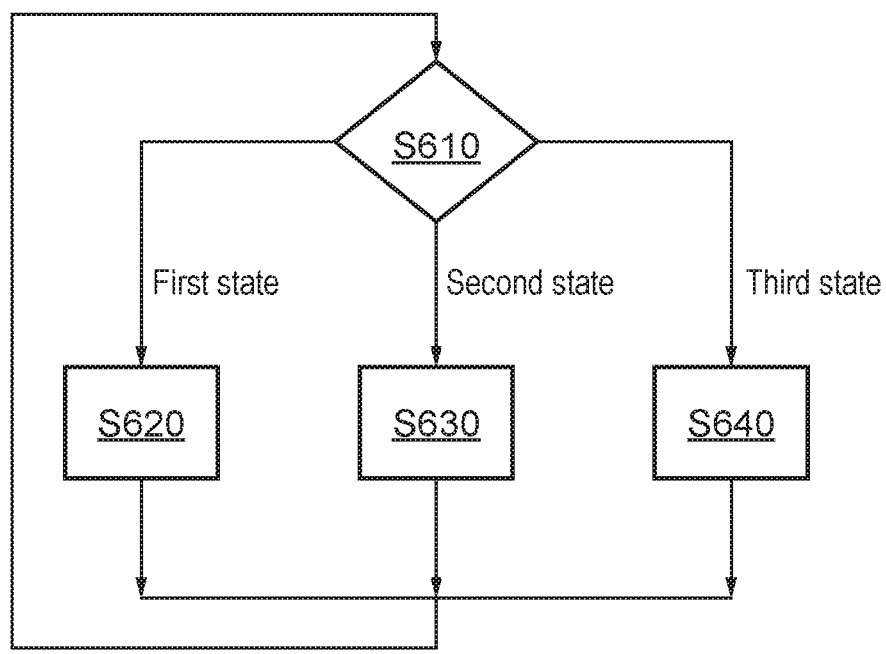
FIG. 6 shows example steps of a method for controlling the gate voltage of one or more transistors in accordance with an aspect of the present disclosure.

FIG. 6 shows example steps of a method for controlling the gate voltage of one or more transistors in accordance with an aspect of the present disclosure.

In step S610, the gate driver system determines the current conduction state of the one or more transistors under its control (for example, the controller of the gate driver system may make this determination).

If it is determined in step S610 that all of the transistors are conducting a current that is less than a current threshold value (for example, all of the transistors are conducting a relatively low current, or some of the transistors are conducting a low current and the others are not conducting any current at all because they do not have a drain-source voltage across them), the method proceeds to Step S620 where the gate driver system operates in the first state. In the first state, the gate voltage is set to a first voltage.

If it is determined in step S610 that all of the transistors are conducting a current that is greater than a current threshold value (for example, all of the transistors are conducting a relatively high current), the method proceeds to Step S630, where the gate driver system operates in the second state. In the second state, the gate voltage is set to a second voltage. The first voltage and second voltage are set such that voltages across the loads that are driven by the source voltages of the one or more transistors are less when the gate driver system is operating in the second state compared with when the gate driver system is operating in the first state, thereby reducing power consumption in the one or more loads when the gate driver is operating in the second state.

If two or more transistors are being controlled and it is determined in step S610 that a subset of those transistors comprising one, but not all, of the two or more transistors is conducting a current that is greater than the current threshold value (i.e., that some, but not all, of the two or more transistors are conducting a relatively high current), the method proceeds to Step S640, where the gate driver system operates in the third state. In the third state, the gate voltage is set to a third voltage. The third voltage is set such that voltages across the loads that are driven by the source voltages of the two or more transistors are greater than when the gate driver system is operating in the second state. Usually, the third voltage is also such that the voltages across the loads that are driven by the source voltages of the two or more transistors are less than when the gate driver system is operating in the first state, although this may depend on the characteristics of the transistors (for example, the $V_{GS}$ of the transistors and any limitations on what voltage the gate driver can set the gate voltage to). It will be appreciated that step S640 is an optional step that is relevant only to gate driver systems that are controlling two or more transistors.

After setting the gate voltage in step S620, S630 or S640, the method may return to step S610 to monitor for any change in the level of current conduction of the one or more transistors. In this way, the state of the gate driver system may be changed based on any change in the level of current conduction in the one or more transistors/the one or more loads.

In all of the above disclosure, it is explained that in the second state, the gate voltage is controlled such that the voltage across the load that is less than the voltage across the load in the first state. However, it will be appreciated that this may only be true when the transistor is conducting current in the first state and therefore has a voltage at the source of the transistor. For example, since in the first state the channel current is below the current threshold value, when in the first state the one or more transistors may not be conducting current because there may not be any voltage at the drain(s) of the transistor(s) (for example, the switch 320 in FIG. 1 may be open). Consequently, at some times during the first state, the voltage across the load may be zero. However, the gate voltage in the first state is still at such a level that if the transistor were then to start conducting current at a level below the current threshold value (for example, because switch 320 is then closed), the consequent source voltage would establish a voltage across the load is greater than the voltage across the load during the second state. Consequently, it may be appreciated that the gate voltages are set such that voltages across the one or more loads driven by the source voltages of the one or more transistors are less when the gate driver is operating in the second state compared with the case when the gate driver is operating in the first state and the one or more transistors are conducting current (i.e., current is following through the channel of the transistor, between the drain and source).

The skilled person will readily appreciate that various alterations or modifications may be made to the above described aspects of the disclosure without departing from the scope of the disclosure.

For example, in the above aspects, the gate driver system controls the gate voltage of one or more n-type enhancement mode transistors. However, in an alternative, the gate driver system may be configured to control the gate voltage of one or more p-type enhancement mode transistors. As will be well understood by the skilled person, p-type transistors have a negative threshold voltage, meaning that a negative gate-source voltage must be applied for the transistor to be turned on. As a more negative gate voltage is applied, the source voltage becomes more negative.

Figure 7:
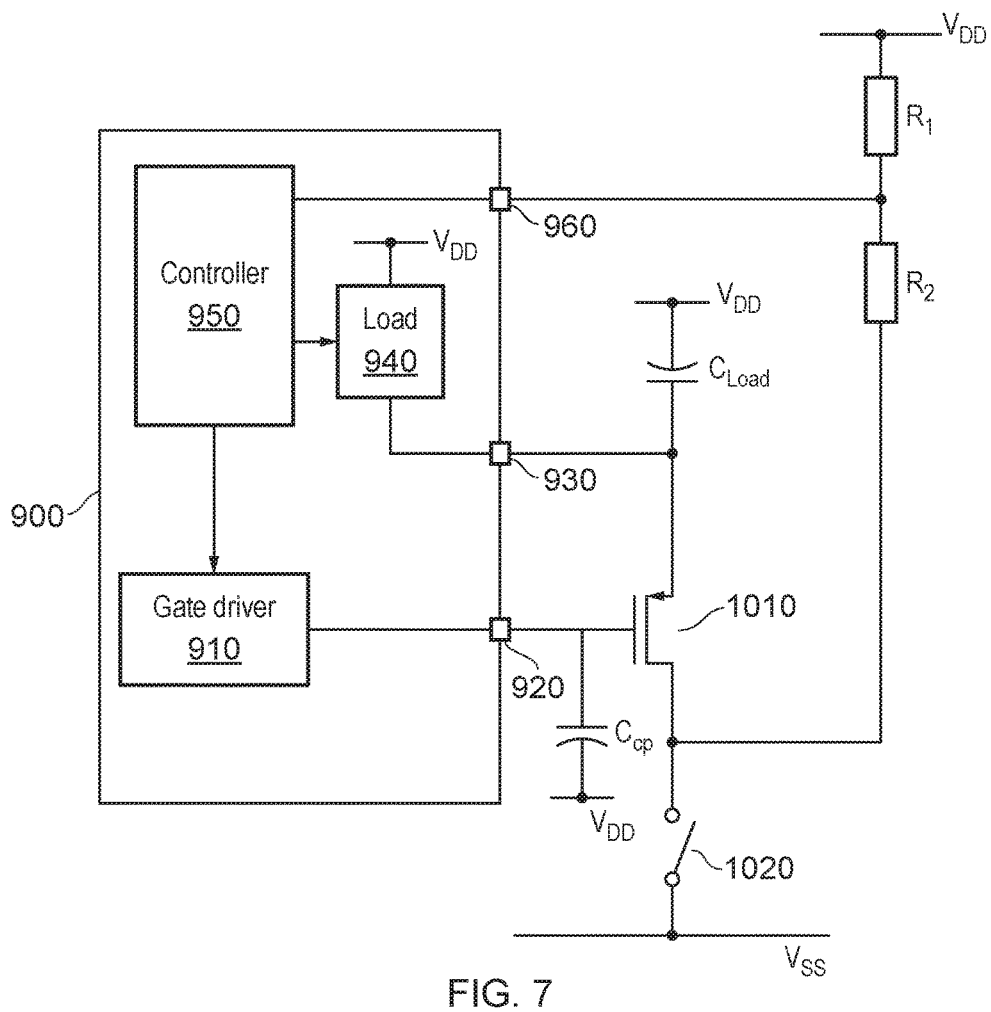
FIG. 7 shows an example schematic diagram of a gate driver system in accordance with a further aspect of the present disclosure.

FIG. 7 shows an example arrangement of a gate driver system 900 in accordance with the present disclosure. In this example, the gate driver system 900 is configured to drive a p-type enhancement mode FET 1010, the drain of which is coupled to a switch 1020 (which may be, for example, a sensing contact as described earlier). However, it will be appreciated that the drain may alternatively be coupled to any other suitable element, such as a power rail. Whilst only one FET is represented in this example, it will be appreciated that the gate driver system 900 may set the gate voltage of two or more p-type FETS, in an analogous way to that represented in FIG. 3.

The gate driver system 900 comprises a gate driver 910, an output terminal 920, a first input terminal 130, a load 940, a controller 950 and a first detector terminal 960, all of the operate in a similar way to that of the gate driver systems described above, except that gate driver system 900 is configured to apply a gate voltage that is relatively negative compared with supply voltage $V_{DD}$. In the first state, the gate driver system 900 sets a gate voltage that causes the voltage across the load 940 to be relatively high (i.e., the gate voltage is very negative compared with $V_{DD}$, thereby setting a relatively low source voltage. Since the voltage across the load 940 is the difference between $V_{DD}$ and the source voltage, this will cause the voltage across the load 940 to be relatively high). For example, if $V_{DD}$ is 10V, $V_{SS}$ is 0V and $V_{GS}$ of transistor 1010 is −2.5V, the gate voltage may be set to 2V, causing a source voltage of about 4.5V and therefore a voltage across the load 940 of about 5.5V. In the second state, the gate driver system 900 sets a gate voltage that causes the voltage across the load 940 to be relatively low (i.e., the gate voltage is less negative compared with $V_{DD}$, thereby setting a source voltage that is closer to $V_{DD}$). For example, if $V_{DD}$ is 10V, $V_{SS}$ is 0V and $V_{GS}$ of transistor 1010 is −3.5V, the gate voltage may be set to 6V, which would to establish a source voltage of about 9.5V, thereby achieving a voltage across the load 940 of about 0.5V, which may be the minimum required to drive the load 940. In the third state (when the gate driver system 900 is setting the gate voltage of two or more transistors), the gate driver system 900 may set a gate voltage that causes the voltage across the load 940 to be higher than the voltage during the second state (and usually also lower than the voltage across the third state, depending on the characteristics of the transistor 1010 and the limitations of how much below $V_{DD}$ the gate driver 910 can set the gate voltage). For example, if $V_{DD}$ is 10V, $V_{SS}$ is 0V and $V_{GS}$ of the transistor conducting a relatively high current is −3.5V, the gate voltage may be set to 4V, which would establish a source voltage of about 7.5V, thereby achieving a voltage across the load 940 of about 2.5V (which may be about equal to the minimum voltage required by the load 940 plus a tolerance voltage).

Thus, whilst most of the above description refers to the gate voltage in the first state being greater (higher) than the gate voltage in the second state, this may be true only for the control of n-type transistors. More generally, for both n-type and p-type transistors, the gate driver system of the present disclosure sets the gate voltages such that the voltage across a load driven by the source of the transistor is less in the second state than in the first state. In this way, power dissipation in the load 940 may be reduced when channel current in the transistor is higher (the second state), whilst still ensuring that during the first state the transistor can remain sufficiently on in the event that the channel current in the transistor should suddenly increase.

Furthermore, it will also be appreciated that the gate driver system of the present disclosure may be configured to control depletion mode transistors, of either n-type or p-type, by suitably setting of the gate voltages.

In the above examples, the controllers of the gate driver systems determine the level of current (i.e., high or low) conducted by the transistors under control by controlling the loads to draw more or less current. However, in an alternative, the controllers may determine the level of current conducted by the transistors in any other suitable way, for example by measuring the current, or receiving a signal from another component indicative of the level of current, etc.

Furthermore, in an alternative configuration, a controller may not be required in the gate driver system. For example, the current in the load may change by any means (for example, it may autonomously change its impedance to draw more or less current, or the impedance may stay the same but the level of current drawn vary by virtue of a change in voltage across the load) and the gate driver may determine the channel current conducted by the transistor and load by any suitable means (for example, by measuring it, by the load communicating the current level to the gate driver, etc). The gate driver may then change its operating state as necessary based on the measured channel current.

In the above disclosure, the channel current in the transistor(s) is assumed to be substantially the same as the current in the load(s) coupled to the transistor(s). In instances where that is not true, the state of the gate driver system may be changed based on the channel current through the transistor(s) or the current drawn by the load, depending on the particular implementation of the gate driver system (particularly as an increase in one will usually result in an increase in the other).

The term "coupled" is used throughout to mean either directly electrically connected, or connected with any one or more components or elements in between, such as wire interconnects, resistors, capacitors, etc.

The invention claimed is:

1. A system for controlling a gate voltage for applying to respective gates of one or more transistors, wherein source voltages of the one or more transistors drive one or more respective loads, the system comprising:
   an output terminal for coupling to the respective gates of one or more transistors; and
   a gate driver coupled to the output terminal and configured to operate in a plurality of states and to set a gate voltage at the output terminal, wherein the gate driver is further configured to:
   operate in a first state of the plurality of states when source currents of each of the one or more transistors are less than a current threshold value; and
   operate in a second state of the plurality of states when the source currents of each of the one or more transistors are greater than the current threshold value, wherein
   in the first state the gate driver sets the gate voltage to a first voltage and in the second state the gate driver sets the gate voltage to a second voltage, and wherein
   the first voltage and the second voltage are set such that voltages across the one or more loads driven by the source voltages of the one or more transistors are less when the gate driver is operating in the second state compared with when the gate driver is operating in the first state and the one or more transistors are in an on-state and conducting current in both the first and second states, thereby reducing power consumption in the one or more loads when the gate driver is operating in the second state.

2. The system of claim 1, wherein the system further comprises:
   a controller configured to control, based at least in part on the source current of each of the one or more transistors, the state in which the gate driver operates.

3. The system of claim 2, wherein the controller is further configured to set the source current of the one or more transistors.

4. The system of claim 3, wherein the controller is further configured to set the source current of the one or more transistors by adjusting the size of the one or more loads.

5. The system of claim 1, wherein the gate driver comprises:
   a voltage source coupled to the output terminal and configured to apply a supply voltage to the output terminal, wherein the first and second voltages are derived, at least in part, from the supply voltage.

6. The system of claim 5, wherein the voltage source comprises a step-up converter.

7. The system of claim 6, wherein the step-up converter comprises a charge pump.

8. The system of any of claim 5, wherein the first voltage is the supply voltage.

9. The system of claim 1, wherein the second voltage is set based at least in part on the source voltages of the one or more transistors and a second state target transistor source voltage.

10. The system of claim 1, wherein the one or more transistors comprises two or more transistors.

11. The system of claim 10, wherein the gate driver is configured to:
    operate in a third state when a subset of the two or more transistors have source currents above the current threshold value, wherein the subset comprises at least one, but not all, of the two or more transistors, and wherein
    in the third state the gate driver sets the gate voltage to a third voltage, and wherein
    the third voltage is set such that when the gate driver is operating in the third state, voltages across the loads driven by the source voltages of the subset of transistors are greater than when the gate driver is operating in the second state.

12. The system of claim 11, further comprising:
    two or more source input terminals for coupling to respective sources of the two or more transistors.

13. The system of claim 12, further comprising:
    an arbitrator coupled to each of the two or more source terminals and configured to determine, when the gate driver is operating in the second state, the source voltage of the two or more transistors that is driving the lowest voltage across the two or more loads, wherein
    the second voltage is set based at least in part on the determined source voltage and a second state target transistor source voltage.

14. The system of claim 13, further configured to:
    determine, when the gate driver is operating in the third state, the source voltage of the subset of transistors that is driving the highest voltage across the respective loads of the subset of transistors,
    wherein the third voltage is based at least in part on the determined source voltage and a third state target transistor source voltage.

15. The system of claim 14, wherein the third state target transistor source voltage is based at least in part on a target transistor source voltage and a tolerance voltage.

16. The system of claim 1, wherein the system is formed on an integrated chip and the output terminal is coupled to a single pin of the integrated chip.

17. A circuit for monitoring a status of a switch, the circuit comprising:
- a transistor comprising a drain contact for coupling to a terminal of the switch;
- an adjustable load coupled to a source contact of the transistor, wherein the load is configured to draw an adjustable load current from the source contact of the transistor, and wherein the status of the switch is determinable based at least in part on the load current; and
- a gate driver coupled to a gate contact of the transistor and configured to set a gate voltage for the transistor, wherein the gate driver is further configured to:
- operate in a first state when the load current is less than a current threshold value; and operate in a second state when the load current is greater than the current threshold value, wherein
- in the first state the gate driver sets the gate voltage to a first voltage and in the second state the gate driver sets the gate voltage to a second voltage, and wherein
- the first voltage and the second voltage are set such that a voltage across the load is less when the gate driver is operating in the second state compared with when the gate driver is operating in the first state and the transistor is conducting current.

18. The circuit of claim 17, wherein the switch is a sensing contact that is linked to a high power switch and is configured for sensing a status of the high power switch.

19. A method for controlling a gate voltage for applying to respective gates of one or more transistors that are each driving a respective load coupled to their respective source terminals, the method comprising:
- setting the gate voltage to a first voltage when channel currents of each of the one or more on-state transistors are less than a current threshold value; and
- setting the gate voltage to a second voltage when channel currents of each of the one or more on-state transistors are greater than the current threshold value, wherein
- the first voltage and the second voltage are set such that voltages across the one or more loads driven by the source voltages of the one or more transistors are less when the gate voltage is set to the second voltage compared with when the gate voltage is set to the first voltage and the one or more transistors are conducting current.

20. The method of claim 19, wherein the one or more transistors comprise two or more transistors, the method further comprising:
- setting the gate voltage to a third voltage when a subset of the two or more transistors have a channel current greater than the current threshold value, wherein the subset comprises some, but not all, of the two or more transistor wherein
- the third voltage is set such that voltages across the loads driven by the subset of transistors are greater when the gate voltage is set to the third voltage compared with when the gate voltage is set to the second voltage.

\* \* \* \* \*